United States Patent [19]

Coleman, Jr.

[11] Patent Number: 5,049,525

[45] Date of Patent: Sep. 17, 1991

[54] ITERATIVE SELF-ALIGNED CONTACT METALLIZATION PROCESS

[75] Inventor: Donald J. Coleman, Jr., Plano, Tex.

[73] Assignee: Texas Instruments Incorporated, Dallas, Tex.

[21] Appl. No.: 546,499

[22] Filed: Jun. 29, 1990

[51] Int. Cl.⁵ .................................. H01L 21/44
[52] U.S. Cl. ............................ 437/195; 437/190; 437/915; 437/984; 148/DIG. 164; 148/DIG. 140
[58] Field of Search ............... 437/189, 190, 195, 915, 437/984, 43; 148/DIG. 164, DIG. 140

[56] References Cited

U.S. PATENT DOCUMENTS

| | | | |
|---|---|---|---|
| 4,612,212 | 9/1986 | Musuoka et al. | 437/195 |
| 4,829,018 | 5/1989 | Wahlstrom | 148/DIG. 164 |
| 4,830,974 | 5/1989 | Chang et al. | 437/43 |
| 4,900,695 | 2/1990 | Takahashi et al. | 437/189 |
| 4,970,177 | 11/1990 | Mizushima | 437/195 |

FOREIGN PATENT DOCUMENTS 2-16736  1/1990  Japan ................................. 437/189

*Primary Examiner*—Olik Chaudhuri
*Assistant Examiner*—Laura M. Holtzman
*Attorney, Agent, or Firm*—James C. Kesterson; James T. Comfort; Melvin Sharp

[57] ABSTRACT

A method is provided for forming multiple layers of interconnection adjacent a planar surface. A first insulator layer is formed adjacent the selected planar surface. A first conductor layer is formed adjacent the first insulator layer. A second insulator is formed adjacent the first conductor layer. A first cavity and a second cavity are formed, each having sidewalls extending through said second insulator layer and said first conductor layer. The first cavity is formed wider than the second cavity. A third insulator layer is conformally deposited adjacent the second insulator layer, such that sidewall insulators are deposited on sidewalls of the first cavity and such that the second cavity is substantially filled with insulator. An etch is performed through the first cavity to expose a portion of the planar surface. A second conductor layer is conformally deposited adjacent third insulator layer such that second conductor layer extends through the first cavity to contact the planar surface.

21 Claims, 3 Drawing Sheets

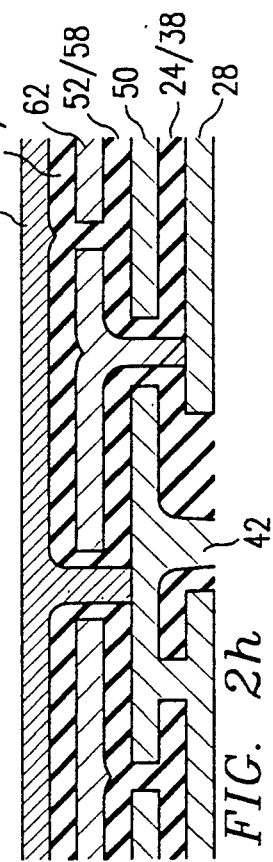
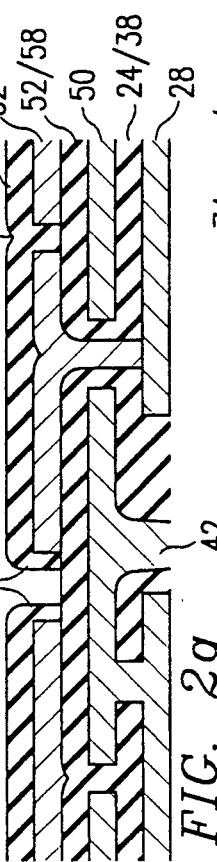
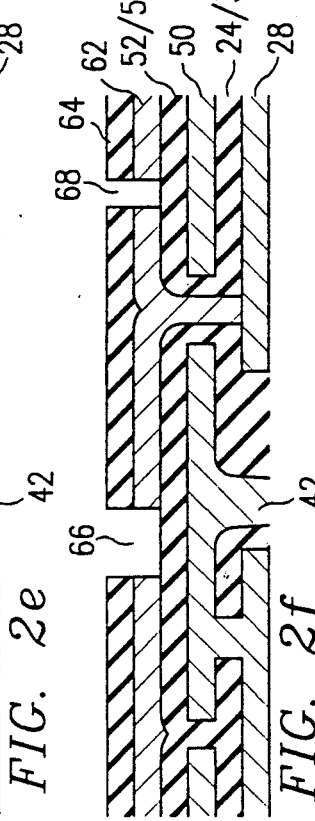
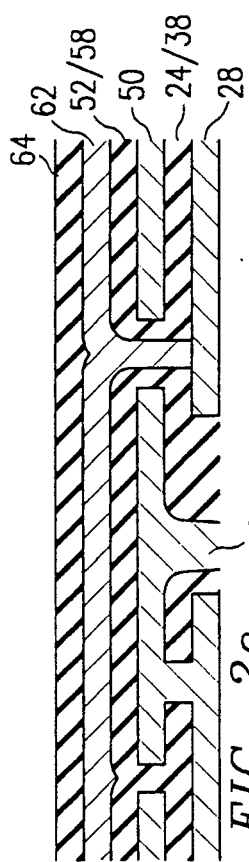
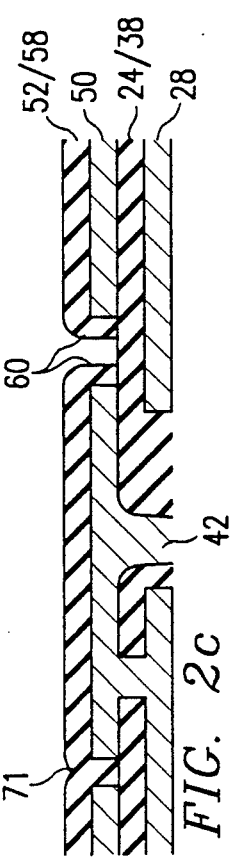
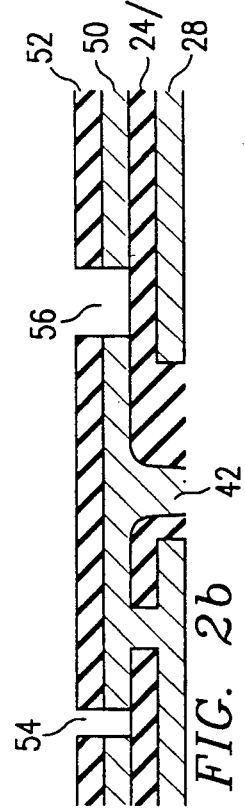
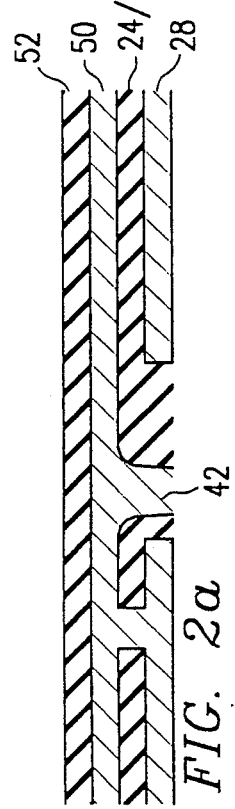

ITERATIVE SELF-ALIGNED CONTACT METALLIZATION PROCESS

TECHNICAL FIELD OF THE INVENTION

The present invention relates generally to integrated circuit fabrication and more particularly to a process for iterative self-aligned contact metallization.

BACKGROUND OF THE INVENTION

The capability to fabricate and interconnect large numbers of functional devices such as transistors, diodes, capacitors and resistors on a semiconductor substrate has lead to the availability of numerous diverse and often complicated integrated circuits. As the complexity of the circuits being fabricated increases, larger number of functional devices are being required on the substrate. Thus, the dimensions of the functional devices are being reduced, which makes the factors of interconnection of the devices and the planarization of the fabrication surfaces critical.

In the current technology, much of the interconnection of functional devices in an integrated circuit is done concurrently with their fabrication. In many cases, interconnection conductors may serve a dual role as a common node for two or more functional devices and as a convenient means for completing a complex maze of interconnections required for circuit functionality. For example, the diffusions necessary for the source and drain regions of transistors may be used as electrical conductors to interconnect nodes within a circuit. Similarly, the polysilicon lines commonly used to form gates for the same transistors may also provide suitable conductors for the creation of interconnections. Although convenient, these techniques have a significant drawback in that interconnection paths may infringe on silicon substrate area that is more suitably used for the creation of functional devices such as transistors and diodes. This problem is especially acute when large numbers of functional devices are required to form a desired circuit, and the available substrate area is at a premium.

Modern integrated circuit technology has advanced to the point where the dimensions of structures in the plane of the silicon are comparable to the thickness of the materials used in their fabrication. The topology thereby created introduces problems during subsequent stages of fabrication, such as contact formation and interconnection by metallization layers.

Field oxidation techniques used for providing isolation in polysilicon gate technology and the polysilicon gate itself, do not lend themselves to planar surfaces over which multiple layers of interconnection can be created. Specialized techniques have therefore been devised to form the required planarized surfaces. Planarization of the surfaces is an important factor which must be considered during the fabrication of circuits using a large number of very small functional devices.

The interconnection of device nodes in an integrated circuit is similar to the interconnection of nodes on a printed circuit board. In the printed circuit board technology, multiple layers of interconnect are obtained by keeping the surface of the board planar during fabrication. A major difference for similar multi-level interconnections in an integrated circuit technology is the presence of the transistor and diode nodes in the starting substrate. Fabrication of the transistors and diodes usually is more commonly dictated by the steps to create them without heavily weighing the subsequent need for planarity during the interconnection stage of integrated circuit fabrication.

Thus, a need has arisen for a means for the multiple layer interconnection of various isolated functional devices in an integrated circuit.

SUMMARY OF THE INVENTION

According to the invention, a method is provided for forming multiple layers of interconnections adjacent a planar surface. A first insulator layer is formed adjacent the selected planar surface. Next, a first conductor layer is formed adjacent the first insulator layer, followed by the formation of a second insulator layer adjacent the first conductor layer. First and second cavities are formed having sidewalls extending through the second insulator layer and the first conductor layer, the first cavity formed wider than the second cavity. A third insulator layer is conformally deposited adjacent the second insulator layer such that sidewall insulators are deposited on the sidewalls of the first cavity and such that the second cavity is substantially filled with insulator. An etch is performed through the first cavity to expose a portion of the planar surface. Finally, a second conductor layer is conformally deposited adjacent the third insulator layer such that the second conductor layer extends through the first cavity to contact the planar surface.

The present invention provides a means for the multiple layer connection interconnection of various isolated functional devices in an integrated circuit. This technique allows for substrate, normally used for the formation of device to device interconnection, to be used for the formation of additional functional devices. The present technique allows for the concurrent creation of the planarized surfaces which are necessary for the successful formation of multiple layers of interconnections. This eliminates the need for several steps of planarizing which might be required in order to form multiple layers of interconnecting conductors.

BRIEF DESCRIPTION OF THE DRAWINGS

Other aspects of the invention and their advantages will be discerned when one refers to the following detailed description as taken in conjunction with the drawings, in which like numbers identify like parts, and in which:

FIGS. 2a-2h are a series of elevational sectional views depicting the formation of multiple layers of interconnections using the iterative self-aligned contact metallization process according to the invention. FIG. 2b substantially corresponds to a section taken along line 202 of FIG. 3.

DETAILED DESCRIPTION OF THE INVENTION

For a more complete understanding of the present invention, reference is now made to FIGS. 1 and 2 of the drawings, like numerals being used for like and corresponding parts of the various drawings.

FIGS. 1a–1g depict a series of steps in which a self-aligned contact iteration process according to the invention is used to provide a multilevel interconnect during the fabrication of a pair of transistors at the face of a layer of a semiconductor. Although, the present invention is depicted for the case of transistors, it can be used with any integrated circuit fabrication process in which isolated active devices are formed on a semiconductor substrate and require multiple layers of interconnect in order to provide a functioning circuit. Further, only a small section of the wafer comprising two transistors is shown; in practice, a large number of devices will be fabricated.

Figure 1A:
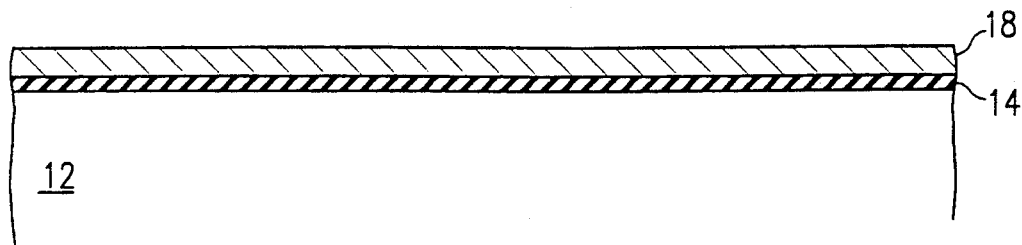
FIGS. 1a-1g are a series of sectional elevational views depicting the process of formation of a pair of isolated functional devices and an associated first level of metallization.

FIG. 1a shows a workpiece generally at 10, which includes a tank 12 of semiconductor. Gate oxide layer 14 has been formed by conventional method across surface 16 of tank 12. A layer 18 of polycrystalline silicon (poly) has next been formed across gate oxide layer 14.

Figure 1B:
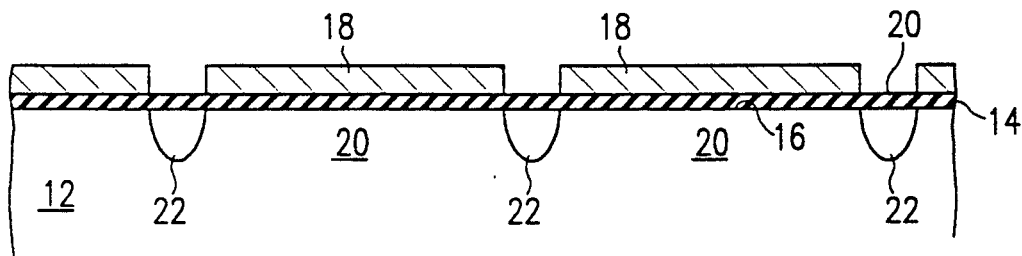

Turning next to FIG. 1b, poly layer 18 has been patterned and etched to define moats 20 which completely enclose a region of silicon that will include the gate, source and drain of a future transistor. Channel stops 22 are formed at this point to isolate adjacent devices.

Figure 1C:
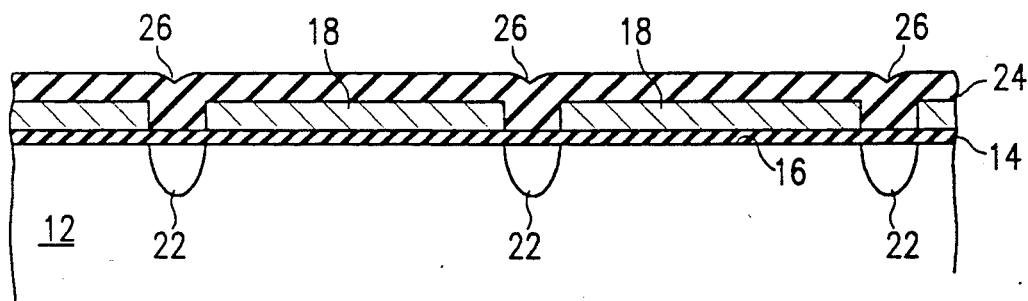

In FIG. 1c, a layer 24 of interlevel insulator, typically an oxide or oxide/nitride/oxide layer, has been conformally deposited across the face of the semiconductor. In general, the conformal deposition has formed a layer 24 which is quite planar. Some minor discontinuities are shown at 26 where the conformally deposited oxide has come together as it was deposited along the vertical edges of moats 20.

Figure 1D:
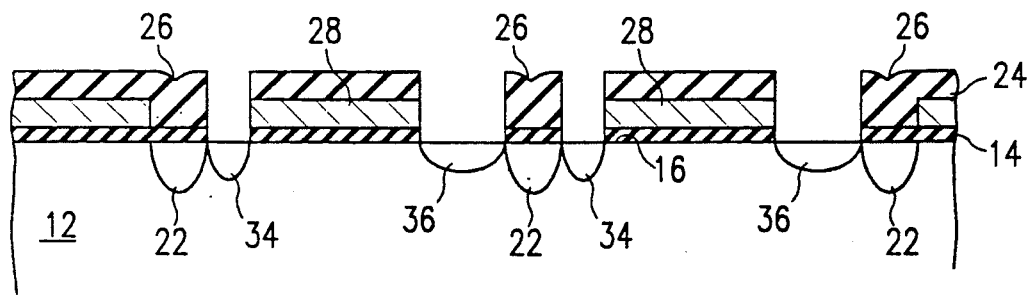

In FIG. 1d, inter-level oxide 26 and poly layer 18 This etch is followed by conventional processing to complete the drain regions 34 and the source regions 36. The drain and source processing require lithography over topography, but do not require a precise pattern definition.

Figure 1E:
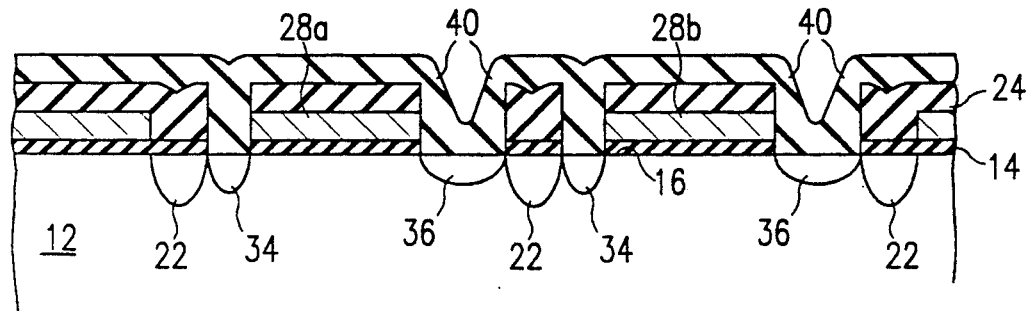

Turn next to FIG. 1e, a conformal layer of insulator 38 is then deposited. This insulator deposition will fill small dimension openings to the silicon substrate as illustrated over the drain regions 34 while forming a sidewall insulators 40 in large dimension openings to the silicon substrate as illustrated over the source regions 36.

Figure 1F:
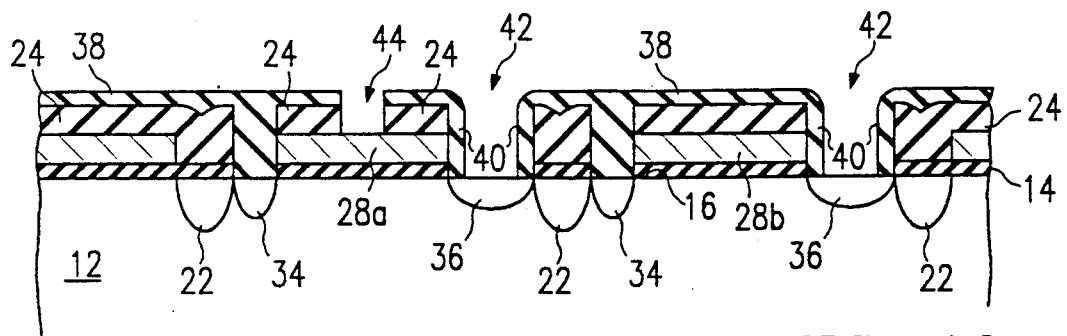

In FIG. 1f, the processing continues with an anisotropic etch of the conformal insulator layer 38. This etch removes the material in a nearly vertical fashion leaving contact holes 42 having sharply defined nearly vertical sidewalls. During this process, the overall insulator 38 has been substantially reduced in thickness. The sidewall insulators 40 along the sidewalls of contact holes 42 will prevent shorting between the gates 28 and subsequently deposited metal to fill contact holes 42. Gates 28 are thus isolated from the subsequent metallization.

This stage of the processing illustrates a primary feature of the self-aligned contact process as has been practiced previously. Namely, the self-aligned contact process prepares contacts to a buried conductor, source regions 36 and drain regions 34 in this example case, with complete isolation from an intervening conductor, gates 28 in this case. Assigning a sequential conductor layer numbered to successive layers of conductors, the self-align contact process provides contacts between layers of equal parity. Since the gate 28 and source regions 36 or drain regions 34 have unequal parity, the self-aligned contact process of the present invention cannot create interconnections between them. All integrated circuits, however, will require connections between the gate and the source or drain layers. To break this parity rule, a special contact 44 to a selected gate 28, in this case gate 28a, is next patterned and etched through insulating layer 24 to expose a contact to gate 28a. This interconnection is critical to the remaining process steps of multilevel interconnect using the self-aligned iterative contact formation process of the present invention. The self-aligned iterative contact formation process of the present invention will only provide interconnection between layers of equal parity, therefore, this process is necessary to provide initial interconnections between levels of unequal parity, in this case between a gate 28 and a source region 36, or a drain region 34. Using the process of the present invention, to connect a pair of layers of unequal parity, it is necessary to form interconnections between layers of interconnect down to the parity breaker and then to form interconnections back up through the layers of the opposite parity until the proper connection is made.

Figure 1G:
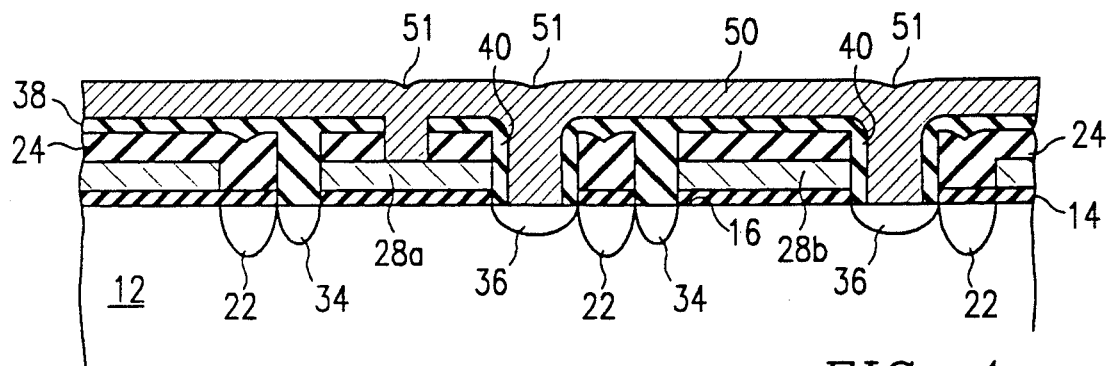

In FIG. 1g, a first layer 50 is conformally deposited. The metal is now prepared for the first iteration of the self-aligned contact metallization process. It is important to note that no contact has been made to gate 28b; this contact will be made to a second metallization layer which will be formed as part of the self-aligned process that simultaneously patterns metal layer 50. In general, the conformal deposition is as planar as it was for the insulators. Some minor continuities are shown at 51, wherein conformally deposited metal has come together as was deposited along the vertical edges of the self-aligned contact formed by insulator 40. These features are relatively minor compared with the topography prior to the conformal deposition, and the resulting metal surface shown in FIG. 1g is therefore quite planar.

Figure 3:
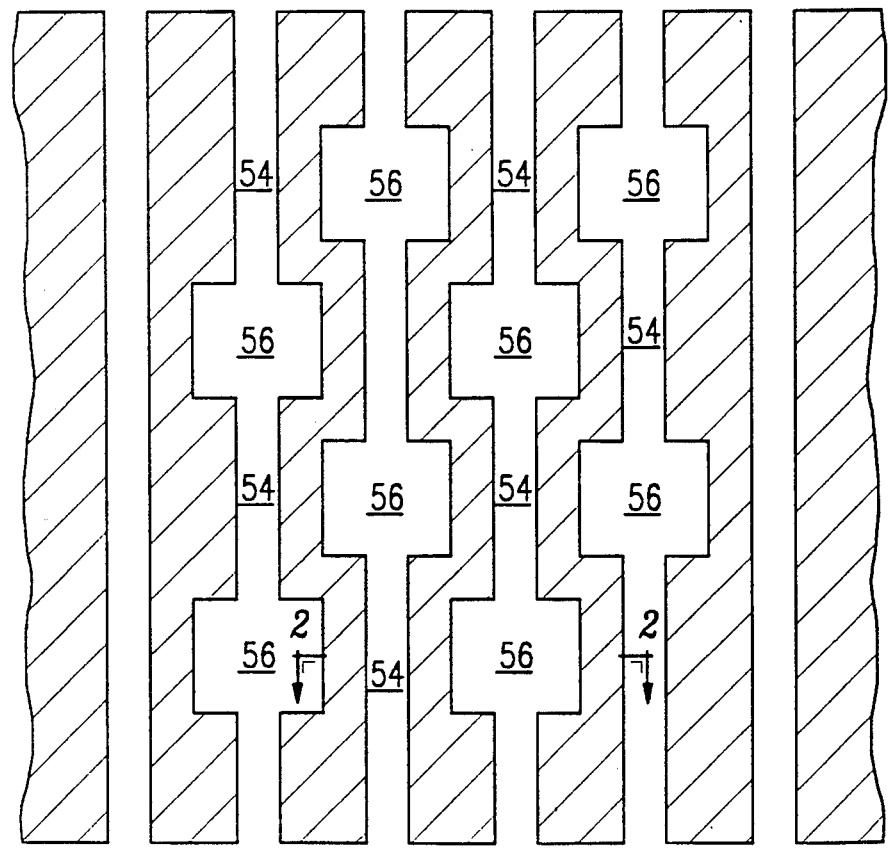
FIG. 3 is a plan view showing a pattern of contact spaces and slots formed during the iterative self-aligned contact metallization process according to the invention.

FIGS. 2a–2h are elevational sectional depictions of a series of process steps in which multiple layers of interconnecting conductor layers are formed by a self-aligned iterative contact formation process according to the invention. FIG. 3 depicts a top view of a complex pattern of slots and contact holes which are created for use during the process according to the invention, a pair of which are discussed in relation to FIGS. 2a–2h. Like designator numbers in FIGS. 1 and 2a–2d and 3 designate like parts, the dimensions in FIGS. 2a–2d and 3 being expanded for additional clarity. In FIG. 2a, an insulator layer 52 has been conformally deposited across metal layer 50.

Next, as depicted in FIGS. 2b and 3, conductor layer 50 is patterned by the formation of a plurality of contact spaces 56 by slots 54 by anisotropically etching through insulator layer 52 and conductor layer 50. The slot 54 and contact space 56 shown in FIG. 2b are a single pair substantially corresponding to a section taken along line 2—2 of FIG. 3. Preferably, as shown in FIG. 3, slots 54 and control contact spaces 56 are continuously formed as a pattern which defines desired conductor paths. The anisotropic etch renders the sidewalls of slots and spaces 54 and 56 sharply defined. Contact spaces 56 are formed substantially wider than slots 54 such that during future process steps discussed below, slots 54 will be substantially filled with insulator while contact spaces 56 remain only partially filled.

In FIG. 2c, an insulator layer 58 has been deposited which substantially fills slots 54 and forms sidewall insulators 60 on the sidewalls of contact spaces 56. During deposition of insulator layer 58, it is critical to maintain a high degree of conformality such that when slots 54 are filled, minimum topological remnants 71 are formed on the upper surface of insulator layer 58. Sidewall insulators 60 will prevent the ends of the now patterned metal layer 50 from shorting to metal later deposited into contact spaces 56. The face of the workpiece 10 has now been substantially covered with a thicker insulator layer 52/58, being formed of the successive deposition of insulator layers 52 and 58.

As shown in FIG. 2d, an anisotropic etch is then performed between sidewall insulators 60 to extend contact spaces 56 through insulator layer 38 to expose the underlying gate 28b. During this process, insulator layer 52/58 is substantially reduced in thickness.

Following the etch through contact spaces 56, conformal deposition of metal is then performed to create a metal layer 62 which contacts conductor layer 28 through contact space 56. Following this step, the substantial advantages of the present invention are realized: metal layer 50 has been patterned while simultaneously an additional interconnection level 62 has been formed which contacts the next lowest level of equal parity, in this case, a selected gate 28b. The use of conformal deposition of insulator and metal has allowed for successive formation of planarized layers which minimize problems resulting from topological discontinuities.

In FIGS. 2 and 3, only a small portion of an integrated circuit workpiece is depicted. During an actual fabrication process, conductor layer 50 may be patterned by etching of a number of cavities, similar to those depicted at 54 and 56 in FIG. 3 to create a complex, high density interconnection of a large number of functional devices. Further, the present process may be repeated to form additional layers of patterned interconnect. The next step of processing would pattern metal layer 62 while simultaneously forming contacts to metal layer 50. This interaction is depicted in FIGS. 2e–h.

In FIG. 2e, an insulator layer 64 has been conformally deposited across metal layer 62. Next, conductor layer 62 is patterned by the formation of contact spaces 66 and slots 68 by anisotropically etching through insulator layer 64 and conductor layer 62; control spaces 66 and slots 68 are depicted in FIG. 2f. The anisotropic edge renders the sidewalls of contact spaces 66 and slots 68 sharply defined. Contact spaces 66 are formed substantially wider than slots 68 such that during future process steps discussed below, slots 68 will be substantially filled with insulator, while contact spaces 66 remain only partially filled.

In FIG. 2g, an insulator layer 70 has been deposited which substantially fills slots 68 and forms sidewall insulators 72 on the sidewalls of contact spaces 66. During the deposition of insulator layer 70, it is critical to maintain a high degree of conformality, such that when slots 68 are filled, minimum topological remnants 71 are formed on the upper surface of insulator layer 70. Sidewall insulators 72 will prevent the ends of the now patterned metal layer 62 from shorting to metal later deposited into contact spaces 66. The face of the workpiece 10 has now been substantially covered with a thicker insulator layer 64/70, being formed of the successive deposition of insulator layers 64 and 70.

As shown in FIG. 2h, an anisotropic etch is then performed between sidewall insulators 72 to extend contact spaces 66 through insulator layer 52/58 to expose the underlying portions of patterned conductor layer 50. During this process, insulator layer 64/70 is substantially reduced in thickness. Following the etch through contact spaces 66, conformal deposition of metal is then performed to create a metal layer 74 which contacts conductor layer 50 through contact spaces 66.

Following this step, the substantial advantages of the present invention have again been realized: metal layer 62 has been patterned while simultaneously an additional interconnection level 74 has been formed which contacts the next lowest level of equal parity, conductor layer 50. The topology shown in FIG. 2h is similar to layer structure with the topologies depicted in FIGS. 2a and 2d, demonstrating the iterative nature of the present invention. Essentially, only the spacing and location of the cavities has varied significantly. Again, the use of conformal deposition of insulator and metal has created the planarized layers which have allowed the successive formation of interconnections with minimum problems as a result of topological discontinuities.

While preferred embodiments of the invention and their advantages have been set forth in the above detailed description, the invention is not limited thereto, but only by the scope and spirit of the appended claims.

What is claimed is:

1. A method of forming multiple layers of interconnections adjacent a planar surface, comprising the steps of:
   forming a first insulator layer adjacent said planar surface;
   forming a first conductor layer adjacent said first insulator layer;
   forming a second insulator layer adjacent said first conductor layer;
   forming first and second cavities having sidewalls extending through said second insulator layer and said first conductor layer, said first cavity formed wider than said second cavity;
   conformally depositing a third insulator layer adjacent said second insulator layer such that sidewall insulators are deposited on said sidewalls of said first cavity and such that said second cavity is substantially filled with insulator;
   etching through said first cavity to expose a portion of said planar surface; and
   conformally depositing a second conductor layer adjacent said third insulator layer such that said second conductor layer extends through said first cavity to contact said planar surface.

2. The method of claim 1, wherein said first cavity comprises a contact space and said second cavity comprises a slot.

3. The method of claim 1, wherein said contact space is continuous with said slot.

4. The method of claim 1, and further forming additional layers of interconnections by repeating said steps of forming cavities, conformally depositing insulator, etching and conformally depositing conductor.

5. The method of claim 1, and further comprising the steps of:
   conformally depositing a fourth insulator layer adjacent said second conductor layer;
   forming third and fourth cavities having sidewalls extending through said fourth insulator layer and said second conductor layer, said third cavity formed wider than said fourth cavity;

conformally depositing a fifth insulator layer adjacent said fourth insulator layer such that sidewall insulators are deposited on said sidewalls of said third cavity and such that said fourth cavity is substantially filled with insulator;

etching through said third cavity to expose a portion of said first conductor layer; and conformally depositing a third conductor layer adjacent said fifth insulator layer such that said third conductor layer extends through said third cavity to contact said first conductor layer.

6. The method of claim 5, wherein said third cavity comprises a second contact space and said fourth cavity comprises a second slot.

7. The method of claim 6, wherein said second slot and said second contact space are continuous.

8. The method of claim 1, wherein said insulator layers comprise conformally deposited oxide layers.

9. The method of claim 1, wherein said conductor layers comprise conformally deposited metal layers.

10. The method of claim 1, wherein said planar surface comprises a layer of conductor.

11. The method of claim 1, wherein said planar surface comprises a metallization layer.

12. A method for forming interconnected conductor layers of equal parity while simultaneously forming a patterned conductor layer therebetween, comprising the steps of:

forming a first conductor layer;

forming a second conductor layer spaced from said first conductor layer by a first layer of insulator;

forming a second layer of insulator across said second conductor layer;

patterning said second conductor layer by etching a plurality of patterned contact spaces and slots having sidewalls extending through said second layer of insulator and said second conductor layer;

conformally depositing a third insulator layer such that sidewall insulators are deposited on said sidewalls of said contact spaces and such that said slots are substantially filled with insulator; and forming a third conductor layer adjacent said third insulator layer, said third conductor layer connecting portions of said first conductor layer through said contact spaces.

13. The method of claim 12, wherein said conductor layers are formed by conformal deposition of metal.

14. The method of claim 12, wherein said insulator layers are formed by the conformal deposition of oxide.

15. The method of claim 12, wherein said spaces and slots are formed by an anisotropic etch which renders said sidewalls of said spaces substantially vertical to said insulator and conductor layers.

16. The method of claim 15, wherein said etch is a gaseous anisotropic etch.

17. A method for forming multiple layers of interconnecting metallization adjacent a workpiece surface including a first metallization layer overlaid with a first oxide layer, comprising the steps of:

conformally depositing a second metal layer;

conformally depositing a second oxide layer;

anisotropically etching at least one contact space and at least one slot having sidewalls extending through said second oxide layer, and said second metal layer, said contact space formed wider than said slot;

conformally depositing a third oxide layer such that sidewall oxides are deposited on said sidewalls of said contact space and said slot is substantially filled with oxide;

performing an anisotropic etch through said contact space to expose a portion of said first metal layer; and forming a third layer of metal adjacent said third oxide layer, said third metal layer contacting said first metal layer through said contact space.

18. The method of claim 17, wherein said contact space and said slot are continuous.

19. The method of claim 17, and further comprising the steps of creating additional levels of interconnections by repeating said steps of conformally depositing metal, conformally depositing oxide, anisotropically etching and forming a layer of metal.

20. The method of claim 17, and further comprising the steps of:

conformally depositing a fourth oxide layer adjacent said third metal layer;

anisotropically etching at least one contact space and at least one slot having sidewalls extending through said fourth oxide layer and said third metal layer, said contact space formed wider than said slot;

conformally depositing a fifth oxide layer such that sidewall oxides are deposited on said sidewalls of said contact space and such that said slot is substantially filled with oxide;

anisotropically etching through said contact space to expose a portion of said second metal layer; and conformally depositing a fourth metal layer adjacent said fifth insulator layer such that said fourth conductor layer extends through said contact space to contact said second metal layer.

21. The method of claim 17, wherein said steps of anisotropically etching reduces the entire profile of a respective exposed layer of said oxide.

* * * * *